(12) United States Patent
Tuggle et al.

(10) Patent No.: US 8,294,093 B1
(45) Date of Patent: Oct. 23, 2012

(54) WIDE APERATURE WIEN EXB MASS FILTER

(75) Inventors: David Tuggle, Portland, OR (US); N. William Parker, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 1 day.

(21) Appl. No.: 13/089,875

(22) Filed: Apr. 19, 2011

Related U.S. Application Data

(60) Provisional application No. 61/476,135, filed on Apr. 15, 2011.

(51) Int. Cl.
*H01J 49/00* (2006.01)

(52) U.S. Cl. ...... 250/296; 250/305; 250/307; 250/396 R

(58) Field of Classification Search .......... 250/294, 250/296, 298, 305, 307, 310, 311, 396 ML, 250/396 R, 492.2, 492, 21, 492.22, 492.3
See application file for complete search history.

(56) References Cited

U.S. PATENT DOCUMENTS

| | | | |
|---|---|---|---|
| 4,755,685 A | 7/1988 | Kawanami et al. | |
| 4,789,787 A | 12/1988 | Parker | |
| 4,929,839 A | 5/1990 | Parker et al. | |
| 4,959,544 A * | 9/1990 | Sukenobu | 250/305 |
| 5,365,064 A * | 11/1994 | Rettinghaus | 250/305 |
| 7,501,644 B2 | 3/2009 | Zani et al. | |
| 7,507,956 B2 | 3/2009 | Frosien et al. | |
| 2002/0104966 A1 | 8/2002 | Plies et al. | |

FOREIGN PATENT DOCUMENTS

FR       2723664       9/1994

OTHER PUBLICATIONS

Teichert, J., et al., "Achromatic two-stage E X B mass filter for a focused ion beam column with collimated beam", Meas. Sci. and Technol., 1993, pp. 754-763, vol. 4.

* cited by examiner

*Primary Examiner* — Bernard E Souw
(74) *Attorney, Agent, or Firm* — Scheinberg & Associates, PC; Michael O. Scheinberg

(57) ABSTRACT

An ExB Wien mass filter provides an independently-adjustable electric field combined with the dipole electric field required for mass separation. The independently adjustable electric field can be used provide a larger optical aperture, to correct astigmatism and to deflect the beam in direction parallel and/or perpendicular to the magnetic field.

17 Claims, 11 Drawing Sheets

WIDE APERATURE WIEN EXB MASS FILTER

This application claims priority from U.S. Provisional Application No. 61/476,135, filed Apr. 15, 2011, which is hereby incorporated by reference.

TECHNICAL FIELD OF THE INVENTION

The present invention relates to charged particle beam systems, and in particular, to a mass filter for an ion beam system.

BACKGROUND OF THE INVENTION

Some focused ion beam (FIB) columns are intended for use with ion sources that emit multiple ion species. In order to select only one of these ion species for the beam to be focused on a substrate, the FIB column will typically include a mass filter. One type of mass filter, a "Wien filter," uses crossed electric and magnetic fields (E×B) to deflect unwanted ion species off-axis, thereby causing them to strike a mass-separation aperture and is also referred to as an "E×B filter." The relative strengths of the electric and magnetic fields are set so that the desired ion species will pass through the mass filter undeflected, then through a mass-separation aperture, and will finally be focused on the substrate surface.

Ions pass through the Wien filter within a "physical aperture," that is, the area enclosed by the electric and magnetic pole faces. Ideally, the magnetic field and the electric field would be perpendicular to each other throughout the entire filter volume surrounded by the electric and magnetic poles. Because the electric and magnetic fields distort toward the edges of the poles, and the fields only approach the ideal perpendicular orientation and correct field strength ratio B/E toward the center of the filter region, the "optical" aperture (i.e., the aperture within which the mass separation is usable) is often much smaller than the physical aperture but larger than the beam diameter within the mass filter. It would be desirable for the magnetic and electric poles to both extend outwards away from the beam axis well past the physical aperture so that the pole ends are away from the filter region, thereby making the fields more uniform within the physical aperture and thus enlarging the actual acceptance aperture. This is impossible, however, since the electric and magnetic poles would physically interfere with each other.

In a focused ion beam column having an intermediate crossover between the source and substrate, the small optical aperture may be acceptable because the beam is relatively small in diameter. Many focused ion beam (FIB) columns include one or more crossovers, typically between multiple lenses in the FIB column. A crossover may be generated in the column to allow a wider range of magnifications between the source and target than might be achievable in a column without a crossover. If a beam is focused to a crossover after passing through a mass filter, there may be a multiplicity of crossovers, all in roughly the same plane, where each crossover corresponds to a different charge-to-mass ratio in the beam. For example, in a silicon-gold alloy liquid metal ion source (LMIS), there would typically be crossovers for singly- and doubly charged monatomic ions of silicon and gold, as well as singly- or multiply-charged silicon and/or gold multi-atomic ions.

If a mass filter aperture having a sufficiently small aperture opening (generally larger than the diameters of the crossovers) is placed in the plane of these crossovers, then only one of these ion species will pass through the aperture to subsequently be focused on the target, while all other ion species will strike the aperture plate and thus be blocked from passing into the lower portion of the FIB column. An advantage of having a crossover is that less dispersion is required in the mass filter to fully separate the various ion species than would be the case without a crossover. The crossover at the mass filter aperture serves as the virtual source for the probe-forming optics below the mass filter. Unavoidable energy spreads in the ion beams will, however, cause a blurring of the crossover along the mass dispersion axis, potentially resulting in blurring of the focused beam at the target.

Crossovers also have disadvantages—1) electrostatic repulsions are increased as the particles are brought closer together at the crossover itself, 2) the beam is generally smaller throughout the entire column due to the crossover, increasing the space-charge repulsions, and 3) sputter damage to the mass separation aperture is increased due to the higher beam current density at the mass separation aperture plate. Electrostatic repulsion due to space-charge effects spread the beam radially (Loeffler effect) and increases the energy spread (Boersch effect), both effects tending to reduce the beam current density at the work piece surface.

In a focused ion beam column without an intermediate crossover, the beam diameters are larger and the smaller optical aperture of a typical prior art mass filter may be more of a problem. There are examples of E×B mass filters in the prior art having a wide optical aperture, but such prior art mass filters have other drawbacks. One example of such a prior art mass filter with a wider optical aperture is illustrated in "Achromatic two-stage E×B mass filter for a focused ion beam column with collimated beam", Teichert, J., and Tiunov, M. A., Meas. Sci. Technol. 4 (1993) pp. 754-763 (see FIGS. 5-8). The electrostatic electrodes in this prior art mass filter (see FIG. 5) are much wider (the vertical dimension of the physical aperture in FIG. 5) than the electrode spacing (the horizontal dimension of the physical aperture in FIG. 5) in order to make the E-field relatively uniform over an optical aperture having roughly the horizontal and vertical dimensions of the electrode gap (i.e., the optical aperture is roughly square while the physical aperture is rectangular with a substantially larger dimension vertically). A more square physical aperture is preferred over a rectangular physical aperture since a larger portion of the area of the physical aperture is then usable for a round beam. The magnetic poles, (as a result of the wide electrodes) are necessarily relatively far apart (vertically in FIG. 5). In order to achieve a high ratio between the width (measured horizontally) of the magnetic pole pieces to the pole piece gap (vertical spacing), this prior art E×B design requires magnetic pole piece widths that are several times larger than the width of the physical aperture (see FIG. 5)—this makes the magnetic circuit relatively inefficient, requiring substantially increased permanent magnet strengths or magnetic coil excitations to achieve adequate B-field strengths in the physical aperture. Section 3 of this reference teaches the prior art design approach of separated electric and magnetic poles, wherein both the electrodes and magnetic poles are electrical conductors and none are electrically resistive. Teichert and Tiunov discuss the optimization of mass separation characteristics of their E×B filter by adjustment of the widths and gaps within the constraints of this prior art design approach.

U.S. Pat. No. 4,929,839 to Parker and Robinson for a "Focused Ion Beam Column" describes an all-electrostatic FIB column with two three-element electrostatic lenses, capable of focusing ion beams on a substrate over an energy range from 4 keV to 150 keV. The column contains an E×B Wien filter and an electrostatic blanker. A single electrostatic octupole below the final lens scans the beam on the substrate.

A large working distance below the final lens enables the potential insertion of additional optical elements for charge neutralization and/or collection of secondary ions for imaging or SIMS. The beam energy at the Wien filter is relatively high, 30 keV, thereby reducing the chromatic aberrations induced by mass separation. An intermediate crossover is formed in the column by the first (upper) lens—this crossover is usually at the plane of the aperture below the Wien filter.

U.S. Pat. No. 4,789,787 to Parker for a "Wien Filter Design" describes a Wien E×B mass or velocity filter in which the optical aperture is a substantial fraction of the size of the physical aperture. The patent describes the use of ferrite magnetic pole pieces for generating the magnetic field generally perpendicular to the direction of the ion beam passing through the Wien filter. An electric current flowing through the ferrite enables the generation of a uniform electric field between the electric pole pieces, with no negative effects due to the magnetic pole pieces. Each of the two ferrite pole pieces is clamped in physical and electrical contact with both of two electric pole pieces, which may be comprised of stainless steel, or any other non-magnetic electrically-conductive material. The voltage applied across the electrodes to generate the electric field causes an electric current to flow through the ferrite which is in contact with the electric pole pieces. There are no separate electrical connections to provide a voltage to the ferrite independent of the voltages applied to the two electrodes. The current straightens the electric field lines in the Wien filter. The described Wien filter is thus characterized as having contact between the electric and magnetic pole pieces in order to accomplish the electric field enclosure process arising from the currents flowing in the two ferrite pole pieces parallel to the direction of the electric field between the two electric pole pieces in the Wien filter.

By small variations in the voltages applied to the electric pole pieces, it is possible to steer the beam side-to-side along the electric field axis. The Wien filter as described in this patent has no capability for applying deflecting fields along the magnetic field axis. In addition there is no capability for applying a quadrupole electric field to stigmate the beam.

SUMMARY OF THE INVENTION

An object of the present invention is to provide an improved E×B Wien mass filter for use with a focused ion beam system.

A preferred E×B filter in accordance with the invention provides an adjustable electric field having components both parallel and perpendicular to the magnetic field. The adjustable electric field can compensate for the non-ideal configuration of the physical electrodes to provide a wide optical aperture. The adjustable electric field can also provide in some embodiments the capability for both X-Y beam deflection, which can be used for beam alignment. The adjustable electric field can also provide in some embodiments beam stigmation, which can be used for correcting some of the aberrations induced by the mass filter.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the invention can provide one or more advantages over typical prior art mass filters and focused ion beam systems. Not all embodiments will provide all the benefits. Some embodiments of the invention provide an E×B mass filter that can separate ion species in the beam based on the species' charge/mass ratio. Some embodiments of the present invention can provide a large optical aperture for a mass filter. Some embodiments of the invention provide for the correction of astigmatism induced by the crossed electric and magnetic fields in the mass filter. Some embodiments of the invention provide for electrostatic deflection of the beam in a direction parallel to the electric field. Some embodiments of the invention provide for electrostatic deflection of the beam in a direction parallel to the magnetic field. Unlike Teichert and Tiunov the present invention enables more efficient magnetic circuits since the pole piece gap is the size of the physical aperture. Because the pole piece gap is smaller, the pole piece widths may also be smaller to obtain the same gap-to-width ratio needed for B-field uniformity within the physical aperture.

In some embodiments, the magnetic poles extend past the filter region, so that the ends of the poles are away from the filter region, thereby producing a more uniform magnetic field in the filter region. In some embodiments, the electric field in the physical aperture defined by the inner surfaces of the magnetic and electric poles is made more uniform by providing linearly-graded electric potentials across the magnetic poles (i.e., parallel to the nominal E×B electric field direction). The linearly-graded electric potentials on the magnetic poles can also deflect the beam parallel to the magnetic field or parallel to the E×B electric field. In addition, the adjustable electric fields may generate the quadrupole electrostatic fields needed for stigmation. The electric potential is produced by applying a voltage across a resistive material on one side of the physical aperture, thereby generating a voltage drop across the resistive material. The resistive material is typically the magnetic pole or a material attached to the magnetic pole. The adjustable electric field is produced across the two resistive poles on opposite sides of the physical aperture. By adjusting the voltages on the two ends of one or both of the resistive materials, the electric field in the filter region can be adjusted.

Figure 1:
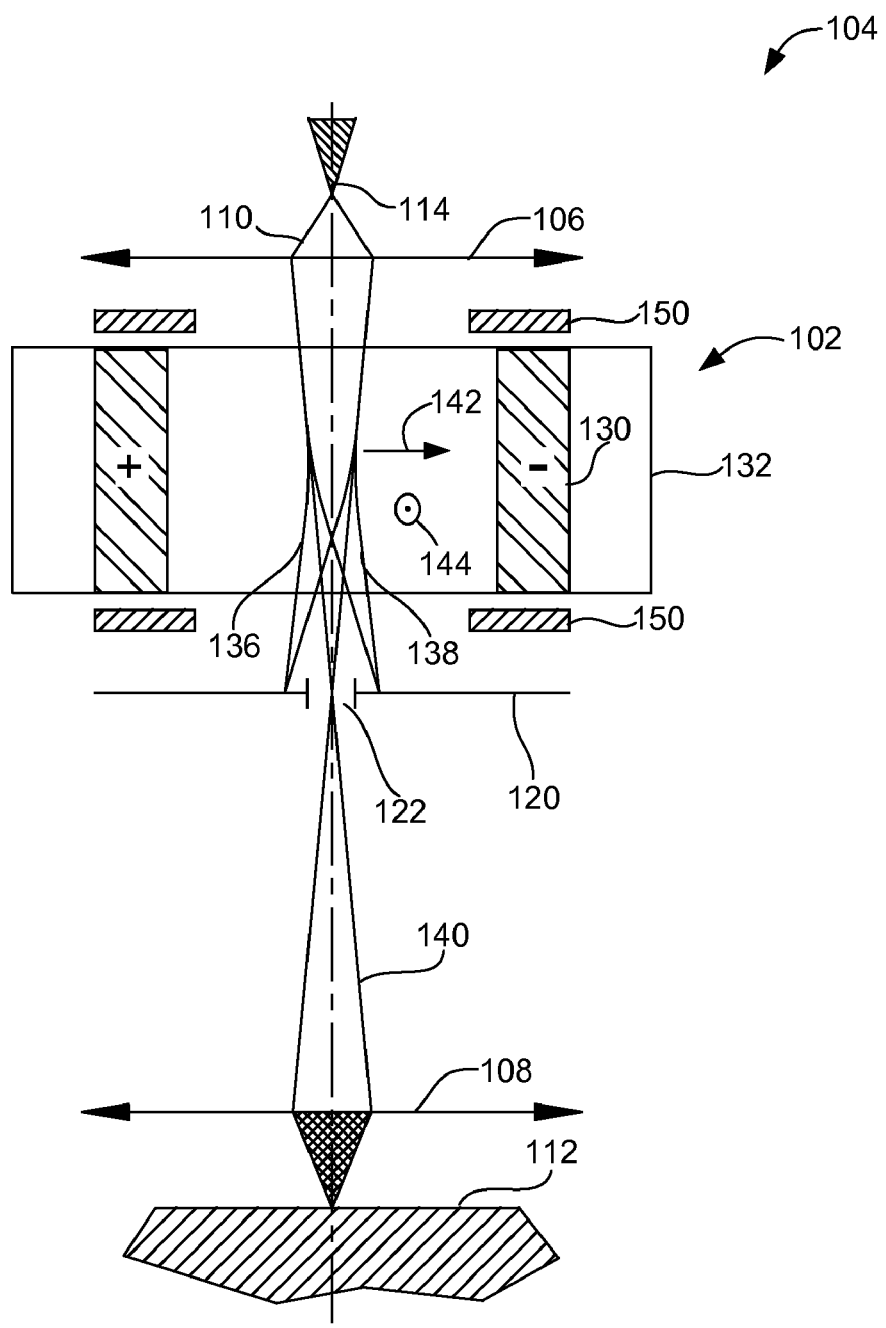
FIG. 1 is a side schematic cross-sectional view of a two-lens focused ion beam (FIB) column that includes a Wien E×B mass filter.

FIG. 1 is a side cross-sectional view of a Wien (E×B) mass filter 102 in a focused ion beam (FIB) column 104 that includes an upper lens 106 and a lower lens 108 that combine to focus an ion beam onto a substrate surface 112. Ions 110 of three different ion species are shown being emitted by a source tip 114 induced by a voltage applied between the source tip 114 and an extractor electrode (not shown). This source structure is typical of a liquid metal ion source (LMIS), however other types of ion sources may be used in the present invention. Ions 110 are then focused by the upper lens 106 into a plane 120 of a mass separation aperture 122. The Wien filter 102, which is shown in more detail in FIG. 2, includes electrodes 130 that produce an electrostatic field and two magnetic poles 132 (one shown). The magnetic poles 132 are in front of, and behind, the plane of FIG. 1, and only the pole 132 behind the plane of FIG. 1 is shown. The magnetic field between the poles 132 can be generated by a current flowing in a coil or by permanent magnets. Wien filter 102 deflects low mass ions 136 and high mass ions 138 off-axis, leaving middle mass ions 140 largely undeflected. These middle mass ions 140 then pass through aperture 122 and are focused by lower lens 108 onto substrate surface 112. Low mass ions 136 have higher velocities for the same beam energy than do high mass ions 138. Since the electric force is the same for all ions (having the same charge) while the magnetic force is proportional to velocity, the faster low mass ions 136 will be deflected more by the magnetic field than the slower high mass ions 138—thus the lower mass ions are deflected in the direction of the magnetic force (to the left), while the high mass ions are deflected in the direction of the electric field (to the right). For middle mass ions 140, the electric and magnetic forces are balanced (i.e., having equal magnitudes in opposite directions), giving no net force.

The E×B filter 102 operates according to principles well-known in the art: crossed electric and magnetic fields (both generally perpendicular to the beam direction through the mass filter) induce forces on the ions in the beam in opposite directions transversely to the beam motion. The relative strengths of these two forces are determined by the electric and magnetic field strengths, controlled by voltage and current supplies that energize the electric poles 130 and magnetic poles 132.

In FIG. 1, an electric field 142 is horizontal in the plane of the figure (pointing from the positive electrode 130 at the left towards the negative electrode 130 at the right—thus the electric force on a positive ion will be directed towards the right), while the magnetic field 144 is perpendicular to, and pointing out of, the plane of the figure (making the magnetic force on a positive ion towards the left). If the ion source 114 is emitting a number of ion species with different charge-to-mass ratios, it is possible to set the electric field 142 and magnetic field 144 so that one species may pass through the E×B mass filter undeflected—in FIG. 1, this species is the middle mass ions 140. The low mass ions 136 and high mass ions 138 are deflected to the left and right, respectively, as shown. Only the middle mass ions 140 pass through the mass separation aperture 122, and are then focused onto the substrate surface 112 by the lower lens 108. At the top and bottom of the E×B mass filter 102, field termination plates 150 cut off both the electric and magnetic fields, thereby reducing aberrations. The ion column 104 includes a crossover in the plane 120 of the mass selecting aperture 122, while other embodiments may not include a cross over, with the virtual source being positioned either above the tip 114 or below the substrate 112.

Figure 2:
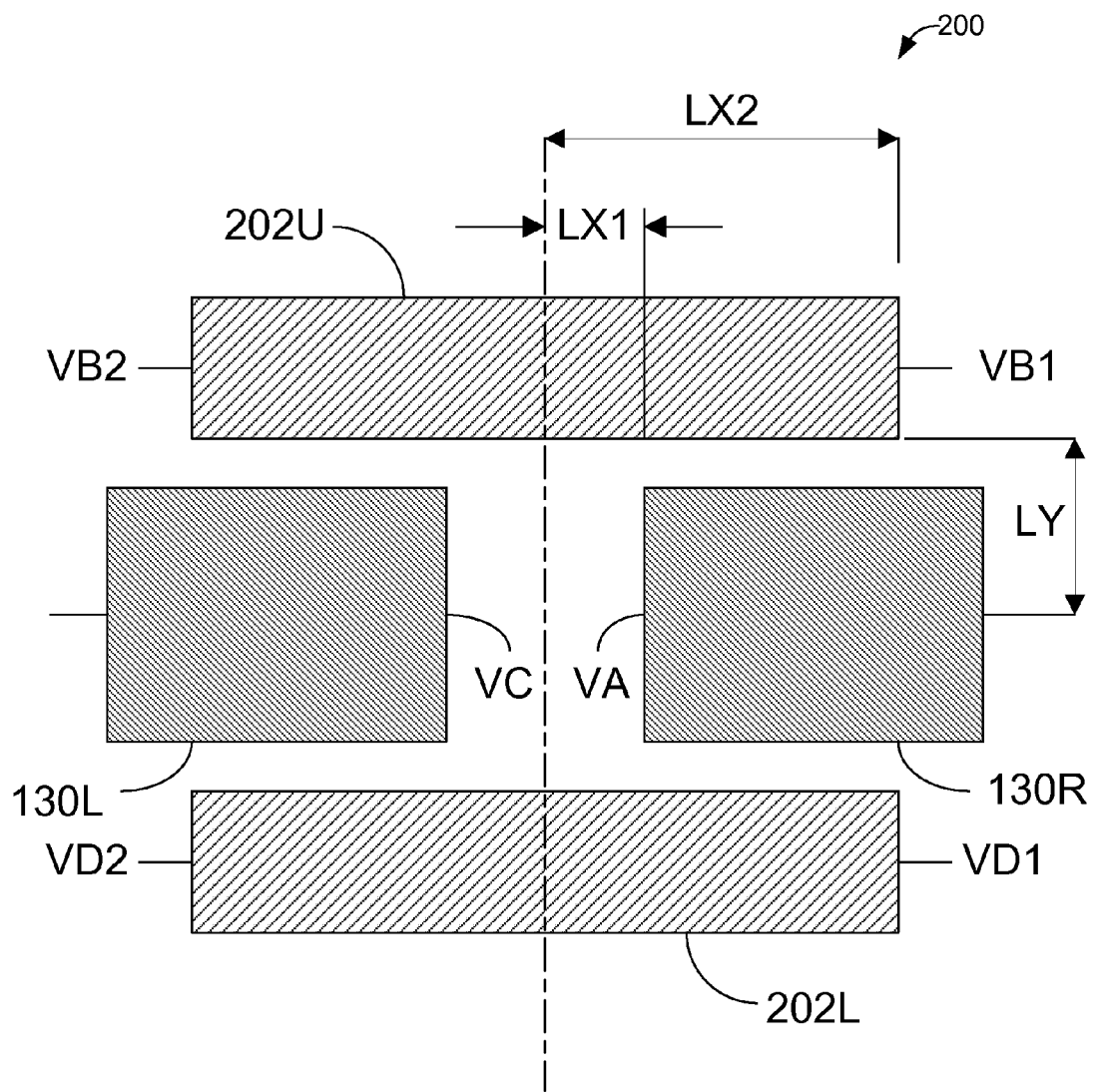
FIG. 2 is a schematic illustration of a Wien filter, shown in a cross-section perpendicular to the general travel direction of ions through the mass filter.

FIG. 2 shows an embodiment of a mass filter 200 that uses two electrostatic pole pieces 130R and 130L, each with a separate electrical connection. Beam motion is assumed to be generally along the Z-axis (perpendicular to the plane of the figure). A first electric pole, 130R, is positioned on the +X-axis at a distance LX1 from the Y-axis (vertical centerline) with an applied voltage VA. A second electric pole 130L is positioned on the —X-axis at a distance −LX1 from the Y-axis with an applied voltage VC. The electric pole faces are oriented parallel to the Y-Z plane. The values of VA and VC would be chosen based on standard Wien filter operating considerations—see below.

There are two magnetic poles, 202U and 202L, positioned with their pole faces oriented parallel to the X-Z plane and at positions ±LY on the +Y and −Y-axes. Either coils and/or permanent magnets may energize the pole pieces 202U and 202L, generating a magnetic field parallel to the Y-axis. The pole pieces 202U and 202L are fabricated from ferrite or some similar resistive magnetic material, typically in a resistivity range from $10^6$ to $10^8$ ohm-cm. The upper (+Y-axis) magnetic pole has two electrical connections, one at the +X end (VB1) and the other at the −X end (VB2). The lower (−Y-axis) magnetic pole also has two electrical connections, one at the +X end (VD1) and the other at the −X end (VD2).

Pole Piece Voltages for Four Exemplary Operating Modes

The four examples provided below show possible voltage values for VA, VC, VB1, VB2, VD1, and VD2, for various operating modes of the mass filter 102 of the invention.

EXAMPLE #1

Voltage Settings with No Deflection or Stigmation

In the case where only mass separation is desired, but no beam steering or stigmation, the voltages to the magnetic poles would be set as follows:

$VB1 = VD1 = (LX2/LX1)Vms$ $VB2 = VD2 = -(LX2/LX1)Vms$

Where the voltages on the electric poles would be:

$VA = Vms$ $VC = -Vms$

The value of Vms is chosen based on the electric field requirements for mass separation, in which the electric and magnetic forces on the ions are balanced for the ion species desired in the beam at the substrate, e.g., middle mass ions 140 in FIG. 1 being focused by lens 108 onto substrate 112.

The common-mode voltage of the overall Wien filter is set to 0 V in this example. If the voltage difference between the ion source and the Wien filter is Vaccel, then the energy of singly-ionized ions would be eVaccel passing through the Wien filter. For positive ions, this would correspond to the case of a positive Vaccel bias on the source relative to the bias on the Wien filter. Note that this discussion does not assume that the Wien filter is necessarily at ground potential, and in fact the Wien filter in the above prior art U.S. Pat. No. 4,929,839 can be floated up to 120 kV from ground, with a voltage difference between the source (at 150 kV) and Wien filter of 30 kV.

Note that in this first example, the electrostatic voltage on axis is 0 V. The voltage drop between VB1 and VB2 is spread across the length of magnetic pole 202U. Similarly, the voltage drop between VD1 and VD2 is spread across magnetic pole 202L. Because VB1=VD1 and VB2=VD2, points having the same X coordinate on magnetic poles 202U and 202L have the same potential, which is the same as the potential at the same coordinate along the X-axis between 130L and 130R. Because the potential varying along the two borders of the physical aperture defined by the magnetic poles 202U and 202L is equal to the varying potential in the space between electrostatic poles 130L and 130R, the electric field lines remain largely parallel to the X axis throughout the physical aperture, extending to the inner surfaces of magnetic poles 202U and 202L—see FIG. 7.

EXAMPLE #2

Voltage Settings with Y-Axis Deflection but No Stigmation

In a second example where mass separation and Y-axis deflection are desired, the voltages to the magnetic poles would be set as follows:

$VB1=(LX2/LX1)Vms+VY$ $VB2=-(LX2/LX1)Vms+VY$ $VD1=(LX2/LX1)Vms-VY$ $VD2=-(LX2/LX1)Vms-VY$

Where the voltages on the electric poles would be:

$VA=Vms$ $VC=-Vms$ as was the case in example #1. The common-mode voltage of the Wien filter 200 is set to 0 V in this example. The Y-axis electrostatic deflection field is generated solely by the ±VY voltages applied to the two magnetic poles. By superposition, the effects of the (horizontal) electric field which is proportional to Vms, may be considered separately from the deflection effect of the (vertical) electric field which is proportional to VY. For the ion mass species which is selected to pass through the mass filter, e.g., middle mass ions 140 in FIG. 1, the net force on the middle mass ions 140 will be solely due to the Y-axis (vertical) E-field induced by the ±VY voltages since the force on the middle mass ions 140 due to the (horizontal) electric field 142 (the first terms in the equations for VB1, VB2, VD1, and VD2 above) will be cancelled by the magnetic force directed in the opposite direction along the X-axis. Thus, the vertical E-field induced by the ±VY voltages will not interfere with the mass-selection operation of mass filter 200 since the vertical electrostatic force is perpendicular to the mass-separation axis (the X-axis).

EXAMPLE #3

Voltage Settings with Stigmation but No Deflection

In a third example where mass separation and stigmation are desired, the voltages to the magnetic poles would be set as follows:

$VB1=(LX2/LX1)Vms-(LY/LX1)^2 Vstig$ $VB2=-(LX2/LX1)Vms-(LY/LX1)^2 Vstig$ $VD1=(LX2/LX1)Vms-(LY/LX1)^2 Vstig$ $VD2=-(LX2/LX1)Vms-(LY/LX1)^2 Vstig$ Where the voltages on the electric poles would be:

$VA=Vms+Vstig$ $VC=-Vms+Vstig$

As was the case in examples #1 and #2, Vms is the electric pole voltage needed for mass separation. The common-mode voltage of the overall Wien filter is set to 0 V in this example. The stigmation electrostatic quadrupole field is generated by the voltages applied to the electrostatic and magnetic poles which are proportional to Vstig—note that an $(LY/LX1)^2$ scale factor for the voltages on the magnetic poles is used to compensate for different gap distances between the electric poles (2 LX gap) and the magnetic poles (2 LY gap)—the reason for the exponent of "2" in the stigmation terms in the equations for VB1, VB2, VD1, and VD2 is that the quadrupole voltages used for beam stigmation increase as the square of distance off-axis, not linearly as in the dipole Y-axis deflections in Example #2, above. The value of Vstig may be either positive or negative, depending on the polarity of the astigmatism.

EXAMPLE #4

General Case—Mass Separation, X-Y Deflection and Stigmation

In a fourth case where mass separation, X-Y deflection, and stigmation are all desired simultaneously, the voltages to the magnetic poles would be set as follows:

$VB1=(LX2/LX1)(Vms+VX)+VY-(LY/LX1)^2 Vstig$ $VB2=(LX2/LX1)(-Vms-VX)+VY-(LY/LX1)^2 Vstig$ $VD1=(LX2/LX1)(Vms+VX)-VY-(LY/LX1)^2 Vstig$ $VD2=(LX2/LX1)(-Vms-VX)-VY-(LY/LX1)^2 Vstig$ Where the voltages on the electric poles would be:

$VA=Vms+VX+Vstig$ $VC=-Vms-VX+Vstig$

Figure 4:
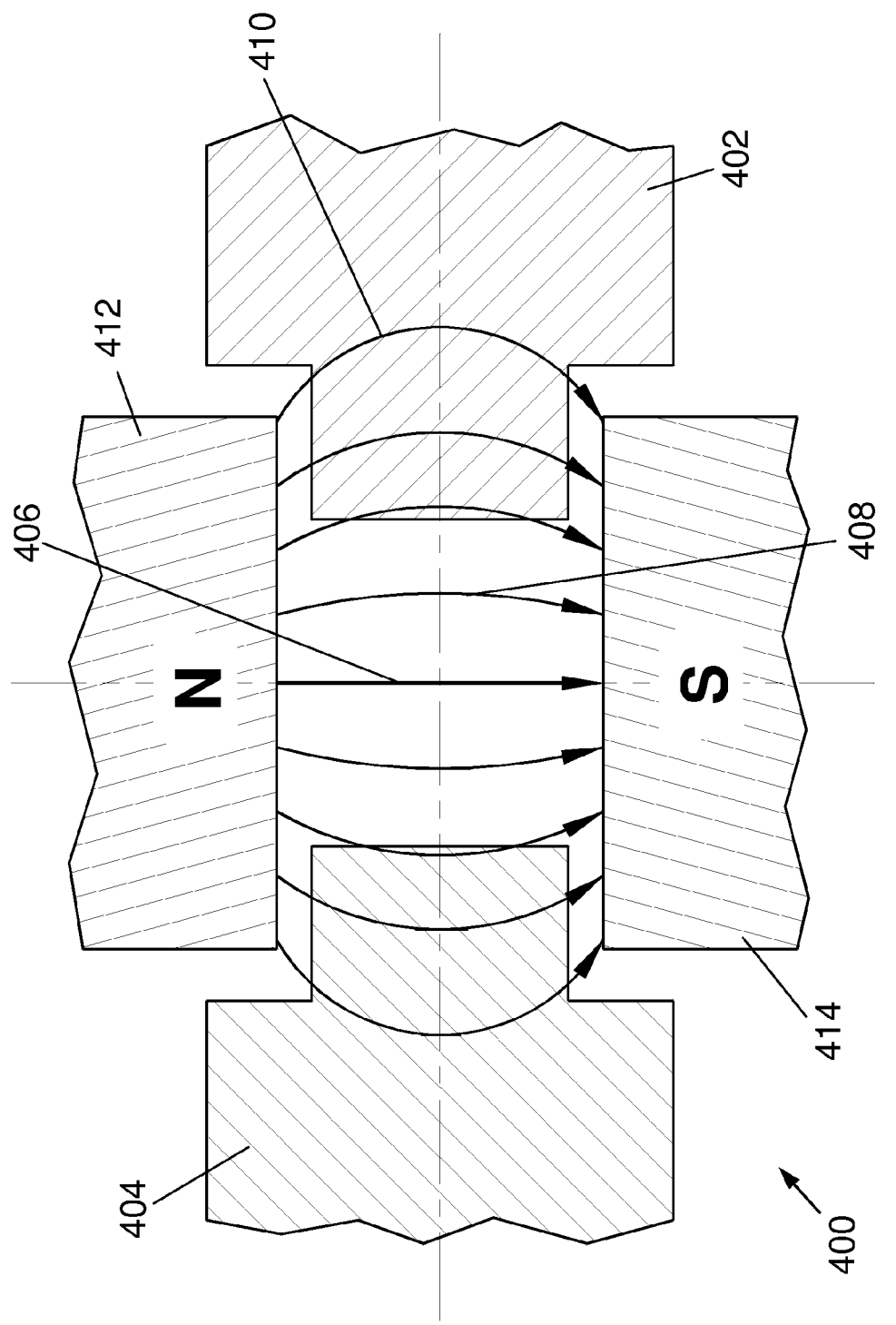
FIG. 4 is an illustration of the magnetic field lines in a prior art Wien filter.

In this most general case, the voltage definitions are as follows:
- Vms=voltage needed for proper mass separation
- VX=X-axis deflection voltage (parallel to mass-separation axis)
- VY=Y-axis deflection voltage (perpendicular to mass-separation axis)
- Vstig=stigmator voltage Magnetic and Electric Fields in a Prior Art E×B Mass Filter FIG. 4 is an illustration of magnetic field lines 406, 408, and 410 in a prior art Wien mass filter 400. The magnetic field extends between the upper (north) pole 412 and the lower (south) pole 414. Assuming electric poles 402 and 404 are made from a non-magnetic material, magnetic field lines 410 will extend through electric poles 402 and 404 unperturbed, as shown. Along the vertical centerline, magnetic lines 406 have the proper orientation—exactly along the Y-axis (purely vertical). Due to the narrow width of the magnetic poles 412 and 414 parallel to the X-axis, magnetic field lines 408 within the physical aperture of the E×B mass filter can be seen to bulge outwards, away from the centerline. This bulging arises from the tendency for the magnetic field to reduce the total stored energy which is proportional to $B^2$ integrated over the volume where B≠0. Farther off axis, such as for magnetic lines 410, this bulging is even more pronounced. It is clear from FIG. 4 that B-field lines 408 do not meet the criterion for proper E×B mass separation, i.e., the local B-field lines are not perpendicular to the local E-field lines (see FIG. 5).

Figure 5:
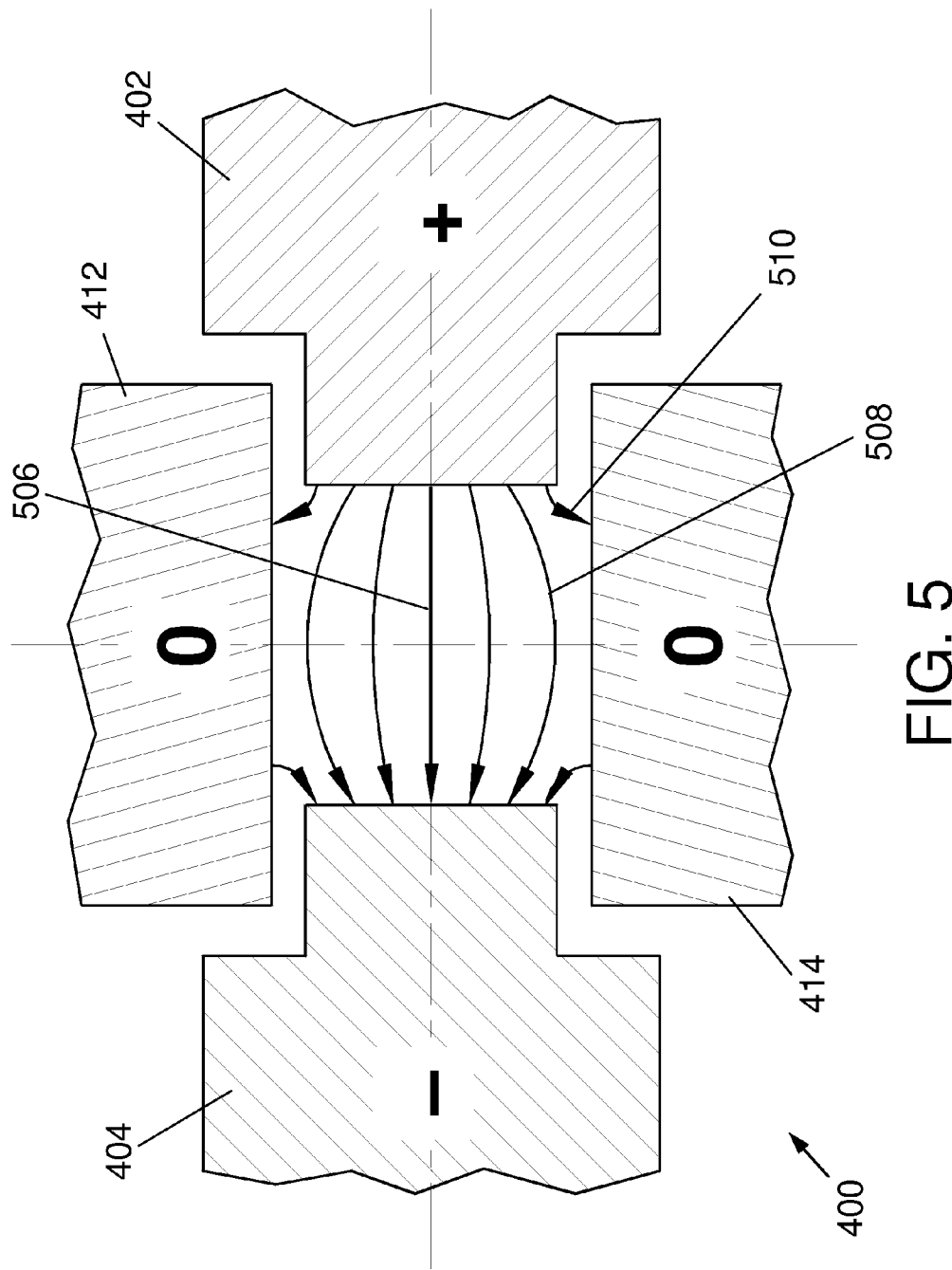
FIG. 5 is an illustration of the electric field lines in a prior art Wien filter.

FIG. 5 is an illustration of electric field lines 506, 508, and 510 in the prior art Wien mass filter 400 shown in FIG. 4. A positive voltage is applied to electric pole 402 and a negative voltage is applied to electric pole 404—this generates a generally horizontal E-field directed to the left of the figure, as shown. Both the magnetic poles 412 and 414 have a 0 V bias applied, corresponding to the 0 V common-mode voltage on the mass filter 400. Along the X-axis, E-field lines 506 are purely horizontal—comparison with FIG. 4 shows that as a result, along the X-axis one E×B operating criterion is met: the E-field is purely horizontal while the B-field (see FIG. 4) is purely vertical—the fields are perpendicular. Along the Y-axis, the E-field lines are horizontal since the E×B mass filter has bilateral symmetry about the Y-axis—thus along the Y-axis, the perpendicularity criterion is also met. An additional problem is that for proper cancellation between the electric and magnetic forces to allow transmission of the desired ion species undeflected, it is also necessary for the magnitudes of the E- and B-fields to have the proper ratio— this is in addition to the requirement for perpendicularity between the two fields. Just as for B-fields, E-fields demonstrate a tendency to bulge outwards to reduce the total stored energy in the electric field which is proportional to $E^2$ integrated over the volume where E≠0. Due to the bulging of the magnetic and electric fields, it can be seen from a comparison of FIGS. 4 and 5 that along the Y-axis, the magnetic field is weakest at the center (the intersection of the X- and Y-axes), and increases towards magnetic poles 412 and 414. The electric field exhibits the same behavior along the X-axis: weakest at the center, and increasing towards electrodes 402 and 404. Thus, even along the X- and Y-axes where the E- and B-fields meet the E×B perpendicularity requirement, the field strengths are varying, contrary to the criterion for proper E×B operation. The farthest out electric field lines 510 are "short-circuited" into the magnetic poles 412 and 414, as shown—this is not significant since the ion beams being mass filtered would not be so far off-axis as field lines 510.

E- and B-Field Criteria for E×B Mass Separation

Some embodiments of the present invention provide a structure for ameliorating the above difficulties in meeting the two criteria for proper E×B mass separation:

1) The E- and B-fields should be perpendicular, with the E-field directed parallel to the X-axis, and the B-field directed parallel to the Y-axis.

2) The E- and B-fields should have the same strength ratio, B/E, at all points in order for the cancellation of the electric force by the magnetic force to apply to the same charge-to-mass ratio ions.

Figure 6:
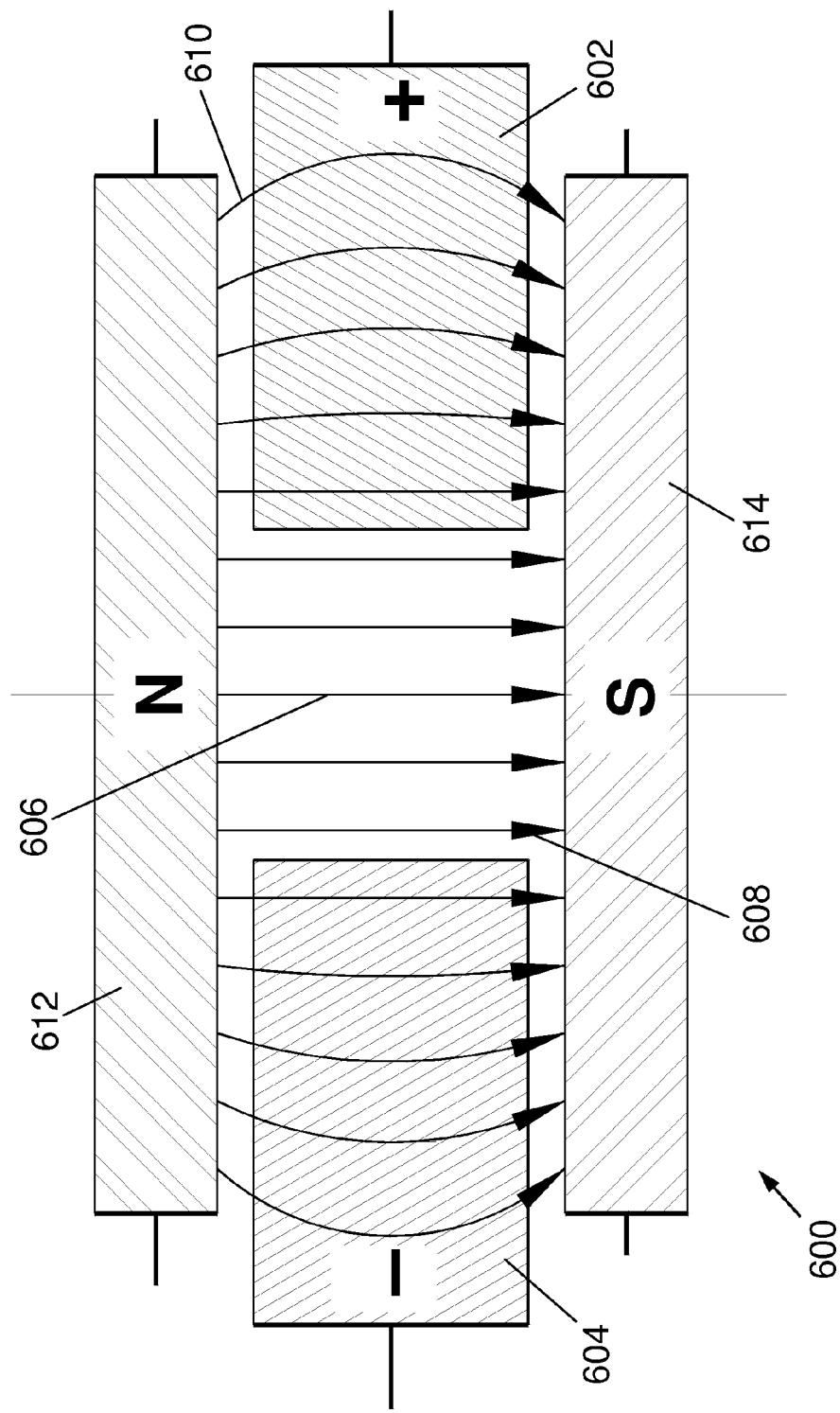
FIG. 6 is an illustration of the magnetic field lines in an embodiment of the present invention implementing only mass separation.
Figure 7:
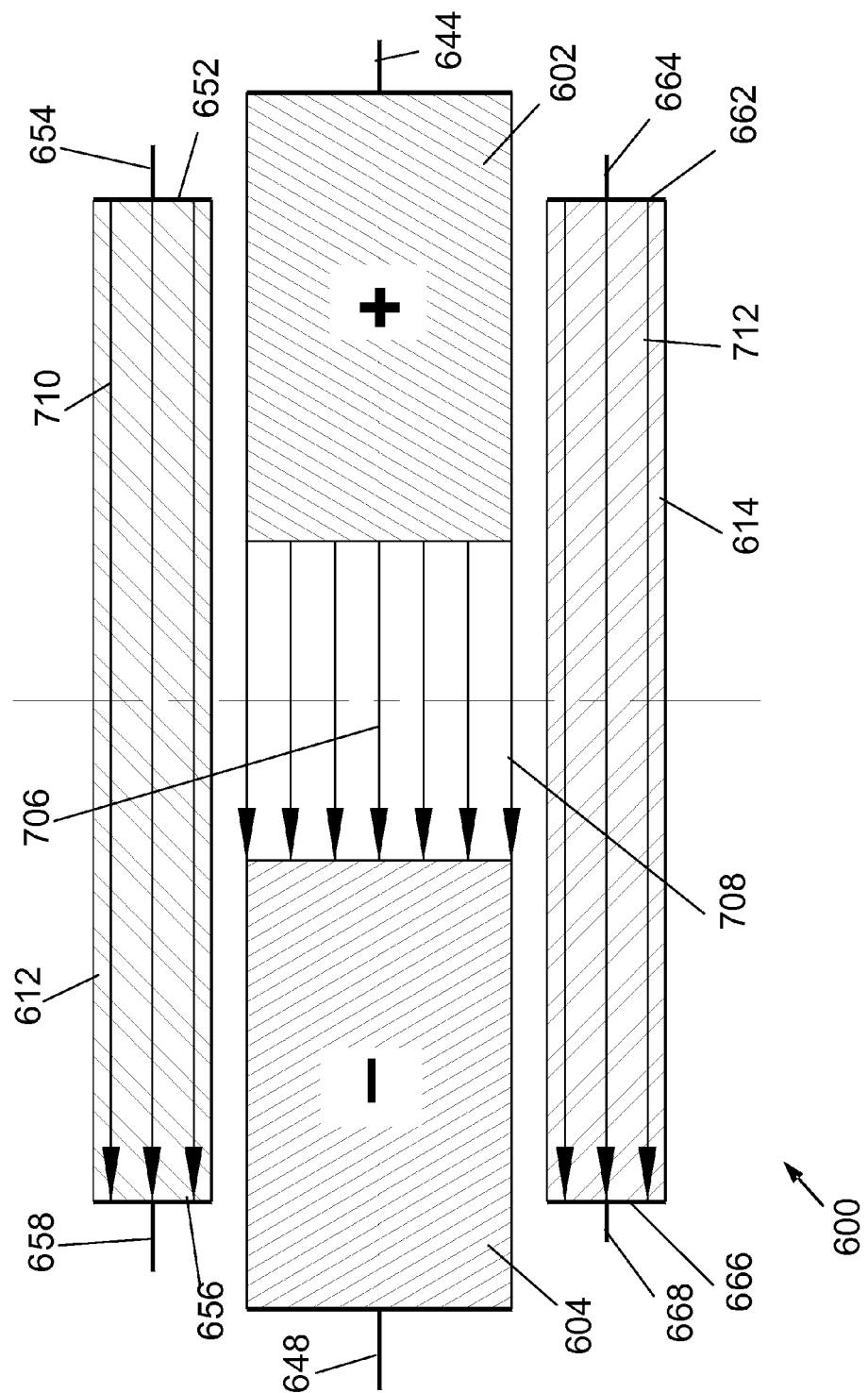
FIG. 7 is an illustration of the electric field lines in an embodiment of the present invention implementing only mass separation.

For maximized transmission of ions through the mass filter with proper mass filtering (i.e., force cancellation for the same charge-to-mass ratio everywhere), it is necessary to meet these two criteria over the largest possible aperture. FIGS. 6 and 7 illustrate the magnetic and electric fields for the present invention, corresponding to FIGS. 4 and 5 for the prior art, respectively.

Electric Fields for Example #1—Mass Separation Only

FIG. 6 is an illustration of magnetic field lines 606, 608, and 610 for embodiment 600 of the present invention according to Example #1, above. The upper (north) pole 612 and lower (south) pole 614 are seen to be much wider relative to the physical aperture of the E×B mass filter, where the "physical aperture" is defined as the physical opening through the mass filter enclosed by the four inner surfaces of the electric poles 604 and 606 and the magnetic poles 612 and 614. The reason why the magnetic poles can be made wider for the present invention is shown in FIG. 7. Because of the wider magnetic poles 612 and 614, the magnetic field lines 608 near the edge of the physical aperture are parallel to the Y-axis, as for the B-field lines 606 at the center. Comparison with FIG. 7 shows that the E×B perpendicularity criterion is met over a large portion of the physical aperture. Although B-field bulging still occurs for B-field lines 610, this bulging is outside the physical aperture and thus has no effect on the operation of the mass filter 600. In all of Examples #1-#4, the magnetic field distribution is as shown in FIG. 6.

FIG. 7 is an illustration of electric field lines 706 and 708 in the embodiment 600 of the present invention shown in FIG. 6. Voltage VA (shown positive in this example—see FIG. 2) is applied to electric pole 602 through electrical connection 644, and voltage VC (shown negative) is applied to electric pole 604 through electrical connection 648. The difference between voltages VA and VC generates a generally horizontal E-field directed to the left of the figure. As described in FIG. 2, magnetic poles 612 and 614 are made from an electrically resistive material. Voltage VB1 (see FIG. 2) is applied to the right end 652 of pole 612 through electrical connection 654. Similarly, voltages VB2, VD1, and VD2, are applied to the ends 656, 662, and 666 of poles 612 and 614 through electrical connections 658, 664, and 668, respectively. The voltage difference between VB1 and VB2 generates an electrical current 710 horizontally through magnetic pole 612, which, since pole 612 is resistive, through Ohm's Law generates a linear voltage gradient across the inner surface of pole 612. Similar considerations hold for resistive magnetic pole 614 due to the voltage difference between VD1 and VD2. FIGS. 6 and 7 apply to Example #1 above, where there are no X-Y deflection dipoles or stigmation quadrupole field added to the E-field required for mass separation.

Electric Fields for Example #2—Mass Separation and Y-Axis Deflection

Figure 8:
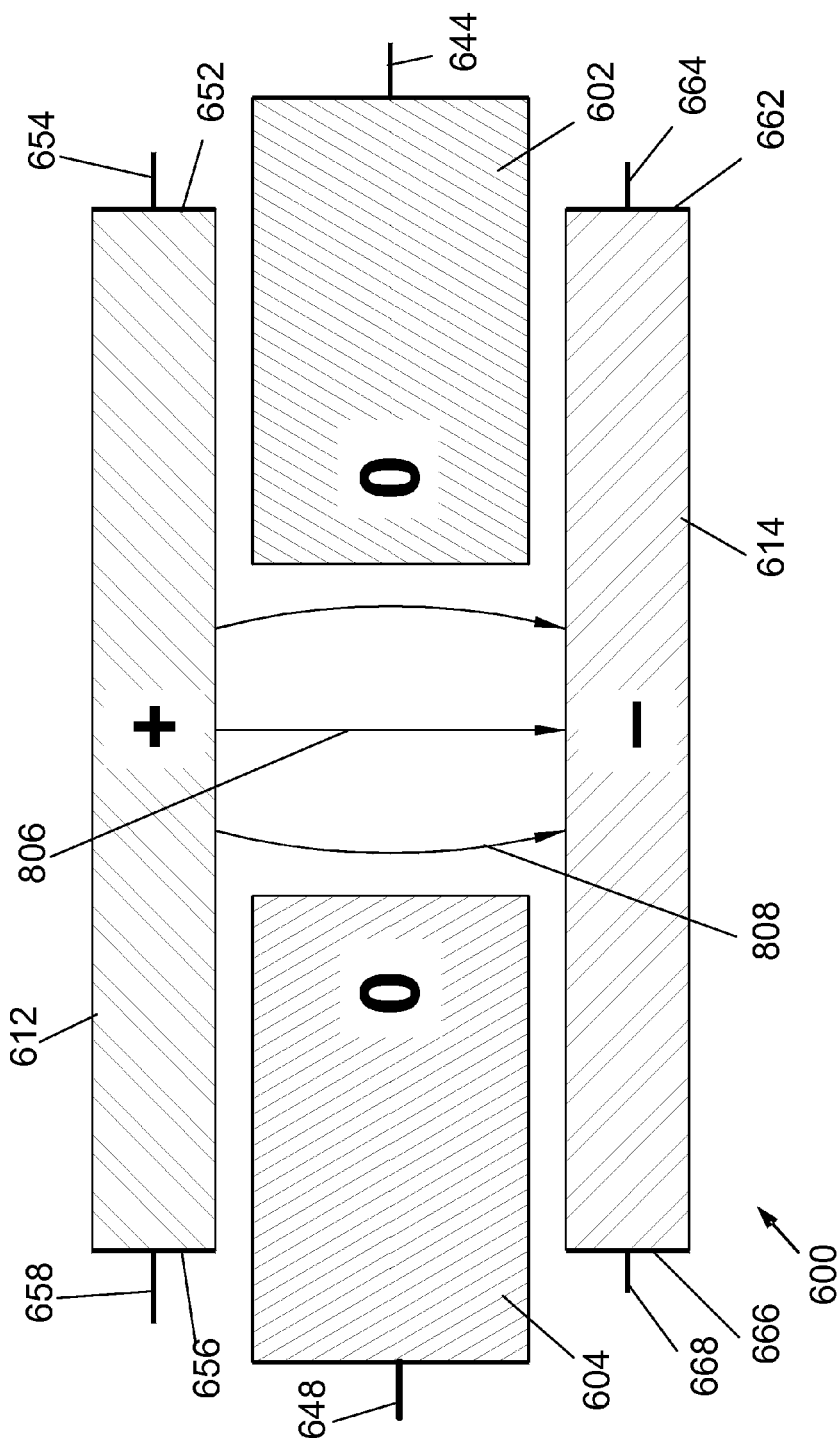
FIG. 8 is an illustration of the electric field lines in an embodiment of the present invention implementing only Y-axis deflection.
Figure 9:
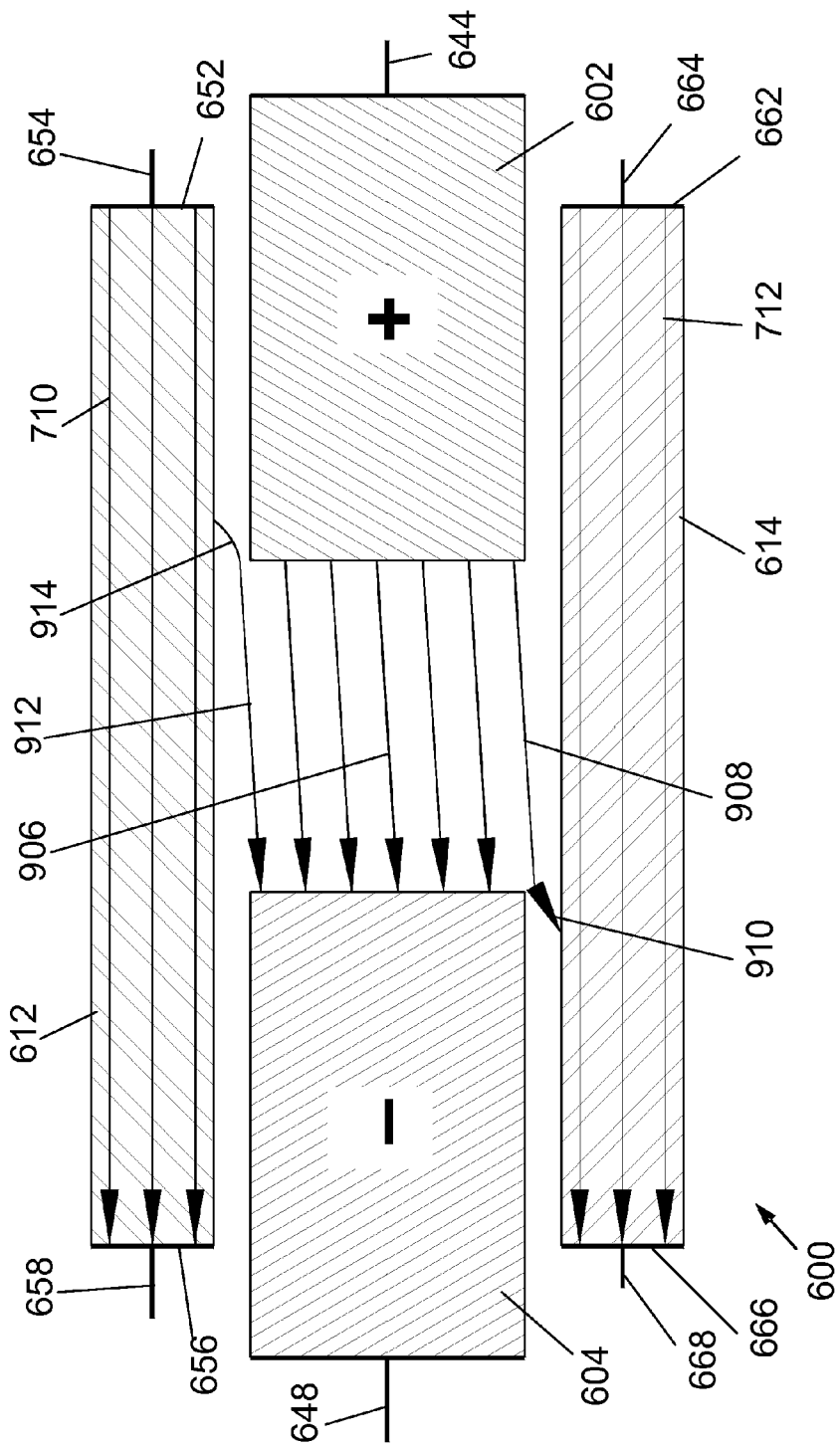
FIG. 9 is an illustration of the electric field lines in an embodiment of the present invention implementing mass separation and Y-axis deflection.

FIGS. 8 and 9 illustrate the effects of adding a dipole E-field for Y-axis beam deflection within the E×B mass filter of the invention as in Example #2, above. FIG. 8 shows only the added E-fields and voltage polarities for generating the Y-axis deflection dipole field. As was discussed in Example #2, above, since E-fields superimpose, we can consider the effects of this added Y-axis dipole E-field separately from the effects of the X-axis E-field required for the mass separation operation of the E×B mass filter. On the Y-axis, the E-field 806 will be parallel to the Y-axis, giving a pure vertical beam deflection. Off-axis, due to the effects of the conducting electric poles 602 and 604, E-field lines 808 will bulge out somewhat as shown—this will cause a small deviation from the desired purely Y-axis deflection. To generate just this deflection E-field, a voltage +VY is applied to both ends 652 and 656 of magnetic pole 612 through electrical connections 654 and 658, respectively, and a voltage—VY is applied to both ends 662 and 666 of magnetic pole 614 through electrical connections 664 and 668, respectively (see formulas in Example #2, above). As far as the generation of the Y-axis dipole E-field only (i.e., neglecting the E×B X-axis E-field), the voltages on the electric poles 602 and 604 will be 0 V, applied through electrical connections 644 and 648, respectively.

FIG. 9 shows the superposition of the X-axis E×B E-field from FIG. 7 and the Y-axis deflection dipole E-field from FIG. 8. The combined E-field in this example has both X- and Y-components, resulting in an E-field tilting downwards and to the left as shown. Precise computer modeling of the operation of the electrodes in the invention has indicated that for Y-axis E-fields smaller than the X-axis E-field required for E×B operation, fairly good E-field uniformity may be achieved, i.e., over the physical aperture the Y-axis deflection may be fairly uniform, while the proper X-axis E-field for mass separation is substantially unaffected by the addition of the Y-axis E-field. Thus, center E-field line 906 and outer field lines 908 and 912 will have almost the same angles relative to the X-axis. With the added Y-axis dipole E-field, outer field line 908 may terminate 910 on the resistive magnetic pole 614. Other outer field lines 912 may start 914 on the resistive magnetic pole 612.

Electric Fields for Example #3—Mass Separation and Stigmation

Figure 10:
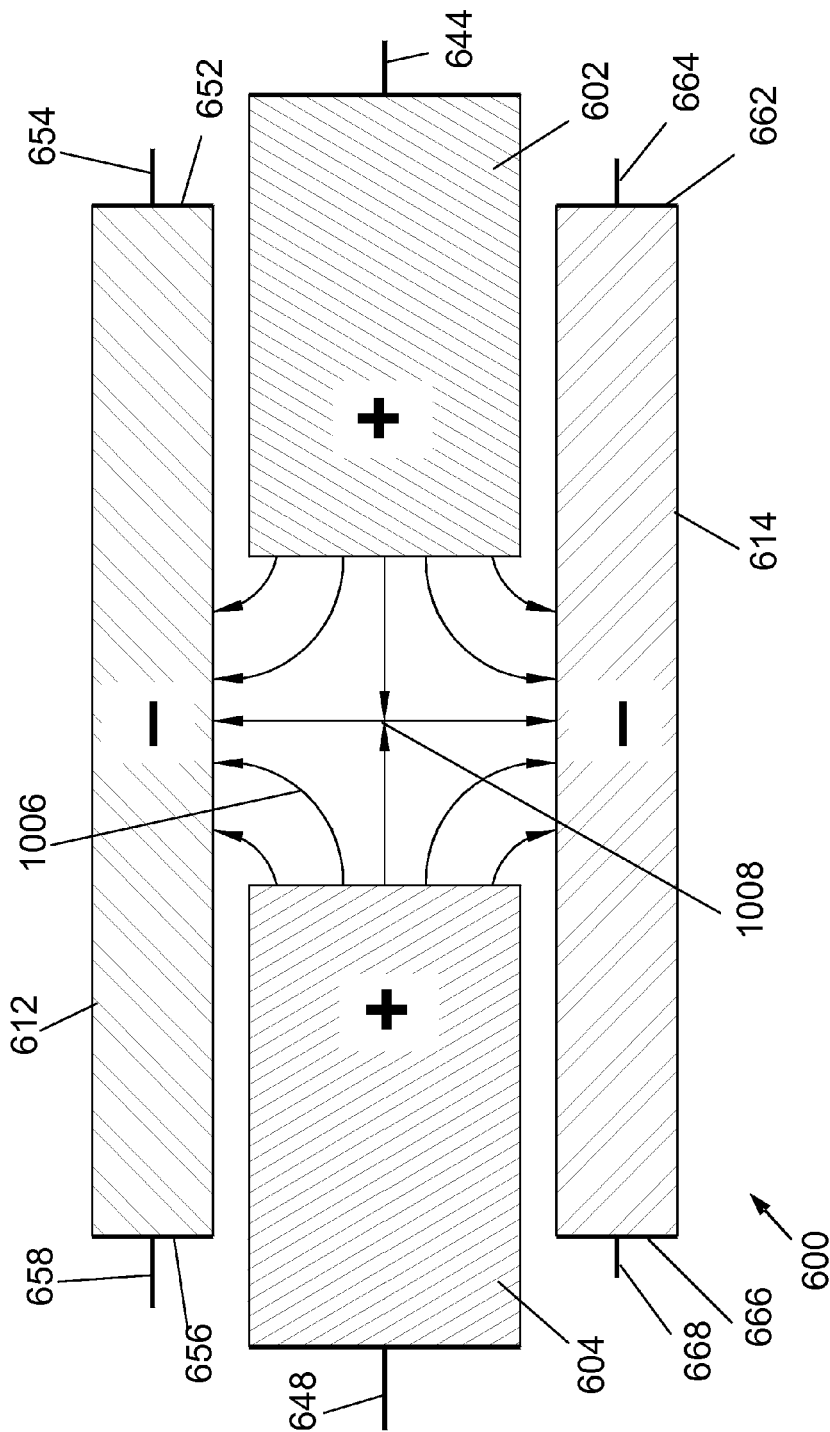
FIG. 10 is an illustration of the electric field lines in an embodiment of the present invention implementing only stigmation.
Figure 11:
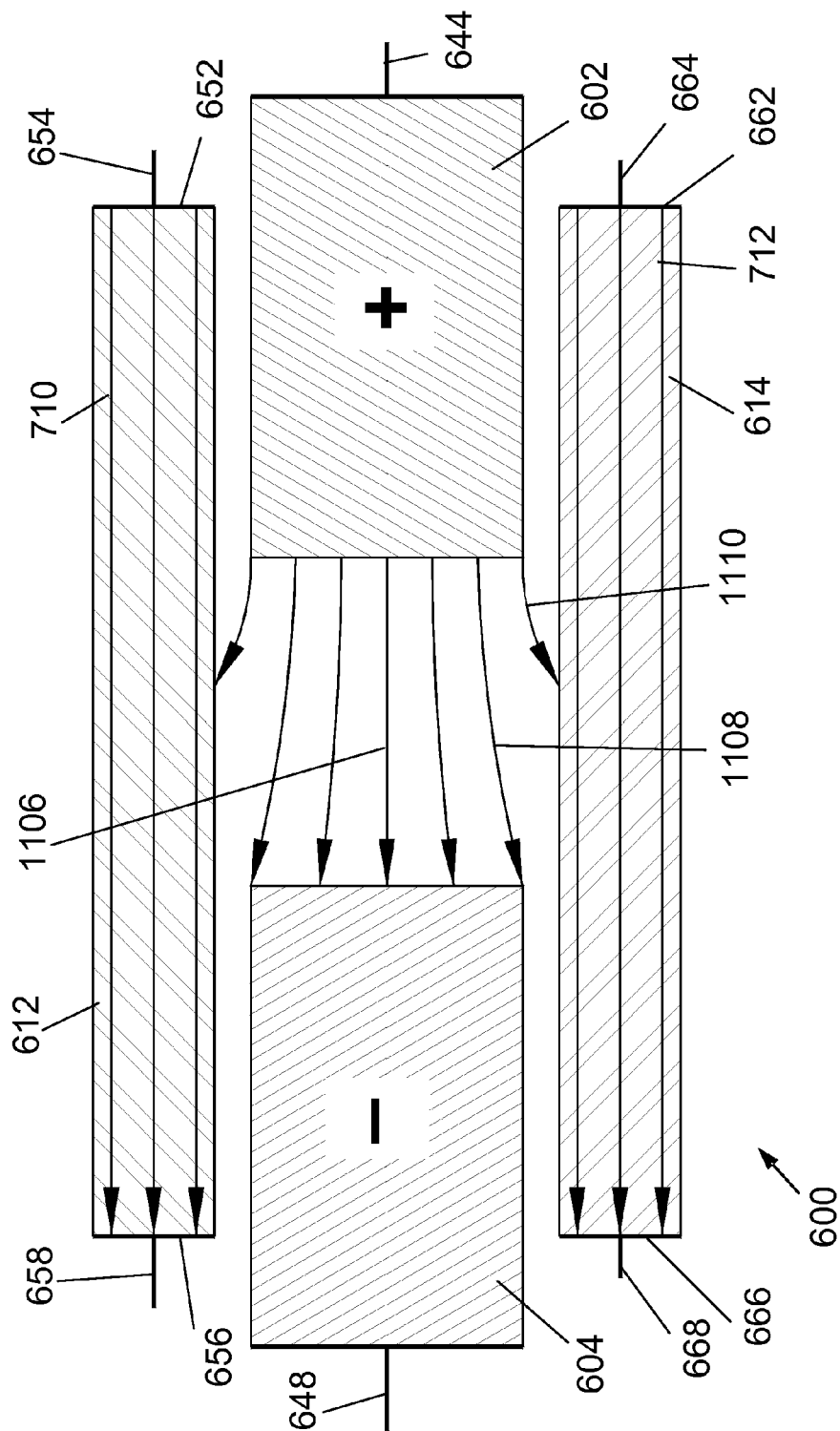
FIG. 11 is an illustration of the electric field lines in an embodiment of the present invention implementing mass separation and stigmation.

FIGS. 10 and 11 illustrate the effects of adding a quadrupole E-field for beam stigmation within the E×B mass filter of the invention as in Example #3, above. FIG. 10 shows only the added E-fields and voltage polarities for generating the stigmation quadrupole field. As was discussed in Example #3, above, since E-fields superimpose, we can consider the effects of this added quadrupole field separately from the effects of the X-axis E-field required for the mass separation operation of the E×B mass filter.

To generate just this quadrupole E-field, a voltage—$(LY/LX1)^2$ Vstig is applied to both ends 652 and 656 of magnetic pole 612 through electrical connections 654 and 658, respectively, and the same voltage—$(LY/LX1)^2$ Vstig is applied to both ends 662 and 666 of magnetic pole 614 through electrical connections 664 and 668, respectively (see formulas in Example #3, above). As far as the generation of the quadrupole E-field only (i.e., neglecting the E×B X-axis E-field), the voltages on the electric poles 602 and 604 will both be +Vstig, applied through electrical connections 644 and 648, respectively.

FIG. 11 shows the superposition of the X-axis E×B E-field from FIG. 7 and the stigmation quadrupole E-field from FIG. 10. The combined E-field illustrated by field lines 1106, 1108, and 1110, is slightly emerging from pole 602 and slightly weaker entering pole 604—this is intuitively reasonable from observation of the field directions in FIG. 10. Some of the outer field lines 1110 will terminate on the resistive magnetic poles 612 and 614, also intuitively reasonable from FIG. 10. Most of the field lines still start and terminate on the electric poles 602 and 604, as in FIG. 7, since we assume here that the quadrupole field strength is substantially lower than the X-axis dipole E-field required for E×B operation.

Typical B-field strengths between poles 612 and 614 may be in the range from 3000 to 6000 Gauss, and more preferably in the range from 4000 to 5000 Gauss. Typical voltages (VA and VC) applied to poles 602 and 604 may be in the range from 1000 to 5000 V, and more preferably in the range from 2000 to 3500 V. Typical voltages applied to the ends of the poles 612 and 614 are scaled proportionately to voltages VA and VC, according to the formulas in FIG. 2. The spacing of the electric poles 602 and 604 parallel to the X-axis may be in the range from 5 to 20 mm, and more preferably in the range from 10 to 15 mm. The spacing of the magnetic poles 612 and 614 parallel to the Y-axis may be in the range from 5 to 20 mm, and more preferably in the range from 10 to 15 mm. The axial length (i.e., the electric and magnetic pole lengths parallel to the Z-axis) may be in the range from 15 to 80 mm, and more preferably in the range from 25 to 40 mm.

Focused Ion Beam Column with an Embodiment of the Invention

Figure 3:
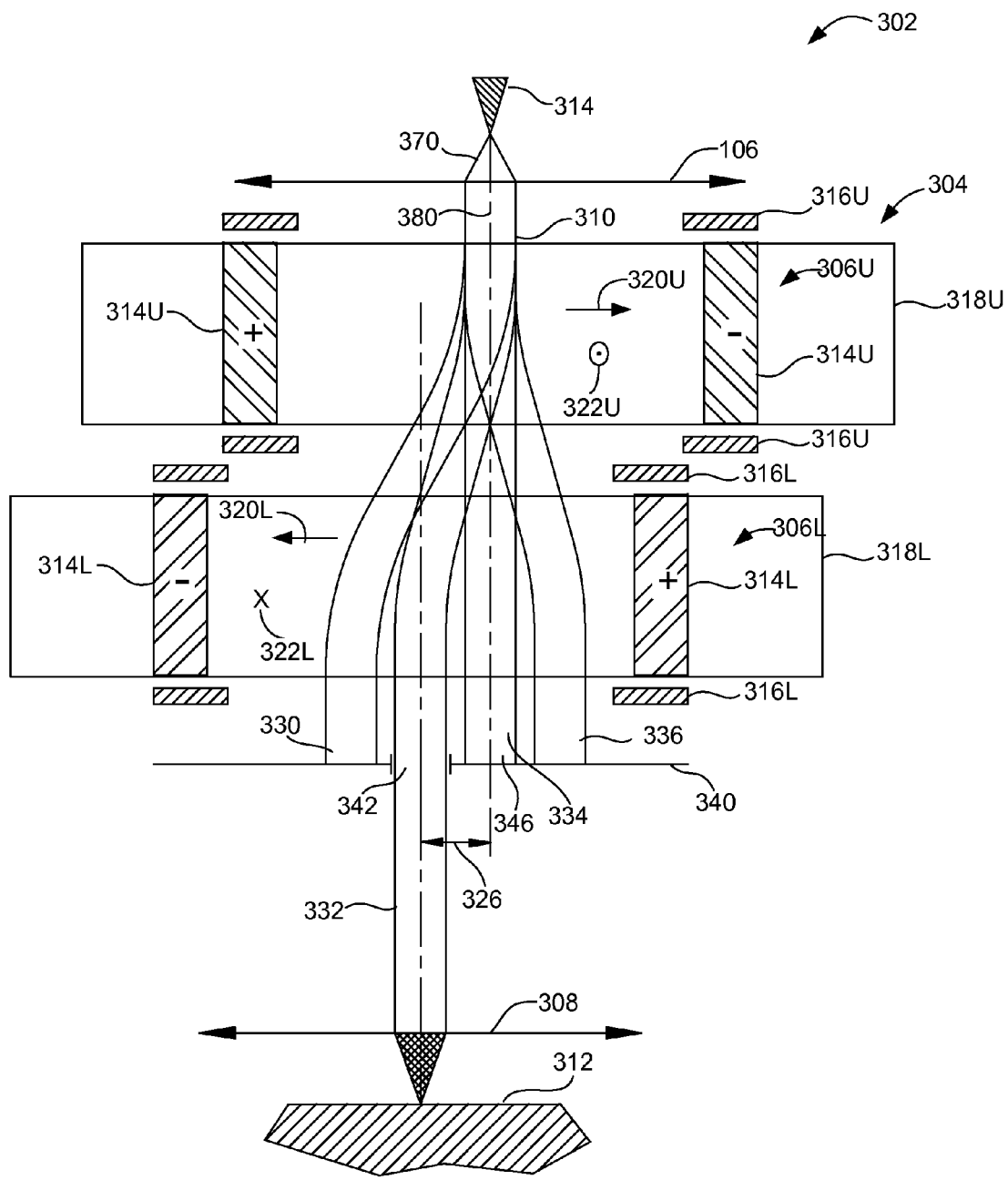
FIG. 3 is a schematic side cross-sectional view of a two-lens column with a double-deflection aberration-corrected E×B Wien mass filter.

FIG. 3 illustrates an ion column 302 that includes a Wien mass filter 304 comprising two E×B mass filters of the invention, an upper E×B filter 306U and a lower E×B filter 306L, both configured as in FIGS. 1 and 2. Such a system is described in Aberration-Corrected Wien E×B Mass Filter with Removal of Neutrals from the Beam, filed concurrently. Ions 370 are emitted from tip 314 of a liquid metal ion source (LMIS)—an LMIS source is shown here for exemplary purposes only, and other types of ion sources, such as inductively-coupled plasma (ICP) ion sources, may alternatively be used with the present invention. Ions 370 are then focused into a parallel, or roughly parallel, beam 310 by upper lens 306. In a completely parallel beam 310, the individual ion trajectories within the beam 310 may be extrapolated back to a virtual source (not shown) at minus infinity along the optical axis 380. A "roughly parallel" beam is a beam for which the virtual source is not necessarily at minus infinity, but for which the extrapolated ion trajectories still intersect the optical axis 380 at least several times farther from the source tip (above or below) than the overall length of the ion column 302. Upper E×B filter 306U includes electrodes 314U, field termination plates 316U, and a magnetic field source comprising two magnetic poles 318U (one shown). Electrodes 314U produce an electric field in the plane of the figure, indicated by arrow 320U (pointing from the positive electrode 314U at the left towards the negative electrode 314U at the right—thus the electric force on a positive ion will be towards the right). The magnetic field source produces a magnetic field coming out of the figure, indicated by circle 322U (making the magnetic force on a positive ion towards the left). Lower E×B filter 306L includes electrodes 314L, field termination plates 316L, and a magnetic field source comprising two magnetic poles 318L (one shown). The upper and lower E×B fields are configured as shown in FIG. 3. Electrodes 314L produce an electric field, indicated by arrow 320L in the plane of the figure, equal in magnitude and opposite in direction to electric field 320U in upper E×B filter 306U. The magnetic field source in lower E×B filter 306L produces a magnetic field going into the figure, as indicated by cross 322L, opposite in direction and equal in magnitude to magnetic field 322U in upper E×B filter 306U. Lower E×B filter 306L is symmetrical with upper E×B filter 306U, typically having an identical structure and producing opposite-direction and equal-magnitude electric and magnetic fields.

Ions 310 include four different ion species as shown: low mass ions 330, lower middle mass ions 332, upper middle mass ions 334, and upper mass ions 336. The low mass ions 330, upper middle mass ions 334, and upper mass ions 336 strike a mass separation aperture plate 340 and do not pass through aperture 342 down to a lower lens 308. The lower middle mass ions 332 pass through both the upper E×B filter 306U and lower E×B filter 306L as shown. Ions 332 then pass through the mass separation aperture 342 and are focused onto substrate surface 312 by the lower lens 308. In the prior art, E×B filters are typically tuned to pass the desired ions (lower middle mass in this example) without deflection. In the embodiment of FIG. 3, the desired ions are deflected to pass through aperture 342 and some of the undesirable ions, (in this example, upper middle mass 334), along with the neutral particles 346, are undeflected and strike aperture plate 340. Other undesirable ions are deflected by the magnetic field too much (e.g., low mass 330) or too little (e.g., high mass 336) to pass through aperture 342.

Neutral particles 346 are undeflected by the electric and magnetic fields in the E×B mass filter 304 and thus pass straight through, striking the mass separation aperture plate 340 because the hole 342 in the aperture plate 340 (which defines the exit axis of the E×B filter 304) is offset by an amount 326 from the entrance axis 380 of the E×B filter 304. Although the schematic of FIG. 3 does not make it clear that there is no path to substrate 312 for neutral particles that are undeflected by lens 306, the geometry of an actual system eliminates such a path by various means familiar to those in the art, such as an aperture at the entrance to upper E×B filter 306U and/or an aperture somewhere in the column below mass filter 304.

While the mass filter is described above being used in a focused ion beam (FIB) column, the mass filter could also be used with any charged particle beam, including electrons (where the E×B filter could be used as a monochromator to reduce the electron energy spread in the beam 310) and charged clusters of particles.

Although the above description characterizes the resistive material, e.g., pole pieces 612 and 614, as magnetic pole pieces, in an alternative embodiment an electrically resistive material may be attached to the surfaces of the magnetic pole pieces 612 and 614. In yet another embodiment, a resistive material may be attached by means of an insulating layer to the surfaces of the pole pieces 612 and 614. In these two alternative embodiments, the electrical connections, such as 654, 658, 664, and 668 would attach to the ends of the resistive material to provide the voltages VB1, VB2, VD1, and VD2, as described in FIG. 2.

An alternative term for the "physical aperture" is the "filtering region", emphasizing that the process of mass filtering occurs within the physical aperture. Although the E×B filter has been characterized as a mass filter herein, since the magnetic force is proportional to velocity and the electric force is independent of velocity, the E×B requirement for balancing the electric and magnetic forces is thus a velocity filtering function. Thus in applications to electron beam columns, such as in scanning electron microscopes (SEMs), transmission electron microscopes (TEMs), or scanning transmission electron microscopes (STEMs), the E×B filter of the present invention may be employed as a velocity filter to narrow the energy range of electrons within an electron beam column.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam filter, comprising:
    a set of first electrodes for providing a first electric field within the filter;
    a set of magnetic poles for providing a magnetic field within the filter and perpendicular to the electric field;
    a set of resistive conductors; and
    a set of second electrodes across each of the resistive conductors, each of the second sets of electrodes causing an electric current to flow across the corresponding resistive conductor to produce an electrical potential gradient across the corresponding resistive conductor, the two resistive conductors together providing a second electric field direction within the filter, the second electric field having a component that is not parallel to the first electric field direction.

2. The charged particle beam filter of claim 1 in which the set of resistive conductors comprises the set of magnetic poles.

3. The charged particle beam filter of claim 1 in which the set of resistive conductors comprises a set of layers attached to the magnetic poles.

4. The charged particle beam filter of claim 1 in which the set of resistive conductors comprises a set of layers attached by means of insulating layers to the magnetic poles.

5. The charged particle beam filter of claim 1 in which each of the magnetic poles in the set of magnetic poles extends beyond the electrodes in the first set of electrodes.

6. The charged particle beam filter of claim 1 in which the electrical potential in the physical aperture at each coordinate along the electric field direction of the first electric field poles and the electric potential at each point on the inner surfaces of the magnetic poles are the same, with the exception of any stigmating or deflecting fields.

7. The charged particle beam filter of claim 1 in which the second electric field is a dipole field oriented parallel to the magnetic field.

8. The charged particle beam filter of claim 1 in which the second electric field is a quadrupole field.

9. A focused ion beam column comprising:
    a source of ions;
    a first lens for receiving ions from the source;
    a mass filter according to claim 1; and
    a second lens for focusing ions exiting the mass filter onto a work piece surface.

10. The focused ion beam column of claim 9 in which the source of ions is a plasma ion source.

11. The focused ion beam column of claim 9 in which the source of ions is a liquid metal ion source.

12. The focused ion beam column of claim 9 further comprising a second mass filter, the second mass filter correcting the chromatic aberrations from the first mass filter.

13. A method of filtering ions, comprising:
    providing a source of a first electric field in a filtering region;
    providing a source of a magnetic field in the filtering region, the magnetic field being perpendicular to the electric field;
    providing a source of a second electric field in the filtering region, the second electric field having a component that is parallel to the magnetic field, the source of the second electric field being adjustable independently of the source of the first electric field; and directing ions having various charge-to-mass ratios through the filtering region to separate ions having different charge-to-mass ratios.

14. The method of claim 13 in which providing a source of a second electric field in the filtering region includes providing an electric current across a magnetic pole piece that is part of the source of the magnetic field.

15. The method of claim 13 which providing a source of a second electric field in the filtering region includes providing an electric current across a resistive conductor attached to a magnetic pole piece that is part of the source of the magnetic field.

16. The method of claim 13 in which providing a source of a second electric field in the filtering region includes providing an electric field to deflect the ion beam.

17. The method of claim 13 in which providing a source of a second electric field in the filtering region includes providing a second electric field, which forms part of quadrupole field for correcting stigmation of the ion beam.

* * * * *